(12) United States Patent
Bazarsky et al.

(10) Patent No.: US 12,424,251 B2
(45) Date of Patent: Sep. 23, 2025

(54) STORAGE SYSTEM AND METHOD FOR CIRCUIT-BOUNDED-ARRAY-BASED TIME AND TEMPERATURE TAG MANAGEMENT AND INFERENCE OF READ THRESHOLDS

(71) Applicant: Sandisk Technologies, Inc., Milpitas, CA (US)

(72) Inventors: Alexander Bazarsky, Holon (IL); Ariel Navon, Revava (IL); Eran Sharon, Rishon Lezion (IL); David Avraham, San Jose, CA (US); Nika Yanuka, Hadera (IL); Idan Alrod, Herzeliya (IL)

(73) Assignee: Sandisk Technologies, Inc., Milpitas, CA (US)

( * ) Notice: Subject to any disclaimer, the term of this patent is extended or adjusted under 35 U.S.C. 154(b) by 278 days.

(21) Appl. No.: 18/220,363

(22) Filed: Jul. 11, 2023

(65) Prior Publication Data

US 2023/0402072 A1     Dec. 14, 2023

Related U.S. Application Data

(63) Continuation-in-part of application No. 17/838,481, filed on Jun. 13, 2022, now Pat. No. 12,283,328, and
(Continued)

(51) Int. Cl.
*G11C 11/00* (2006.01)
*G11C 7/10* (2006.01)
*G11C 11/54* (2006.01)

(52) U.S. Cl.
CPC .......... *G11C 7/1069* (2013.01); *G11C 7/1063* (2013.01); *G11C 11/54* (2013.01)

(58) Field of Classification Search
CPC ..... G11C 7/1069; G11C 7/1063; G11C 11/54; G11C 11/5671; G11C 29/021;
(Continued)

(56) References Cited

U.S. PATENT DOCUMENTS

| | | | |
|---|---|---|---|
| 6,154,157 A | * | 11/2000 | Wong ........................ G06J 1/00 341/110 |
| 7,876,671 B2 | | 1/2011 | Pimlott |

(Continued)

OTHER PUBLICATIONS

U.S. Appl. No. 17/838,481, filed Jun. 13, 2022, entitled "Storage System and Method for Inference of Read Thresholds Based on Memory Parameters and Conditions."
(Continued)

*Primary Examiner* — Hien N Nguyen
(74) *Attorney, Agent, or Firm* — Crowell & Moring LLP

(57) ABSTRACT

A storage system has an inference engine that can infer a read threshold based on a plurality of parameters of the memory. The read threshold can be used in reading a wordline in the memory during a regular read operation or as part of an error handling process. Using a machine-learning-based approach to infer a read threshold can provide significant improvement in read threshold accuracy, which can reduce bit error rate and improve latency, throughput, power consumption, and quality of service. In another embodiment, a circuit-bounded array is used to manage updates to time and temperature tag information and to infer read thresholds.

20 Claims, 19 Drawing Sheets

Related U.S. Application Data a continuation-in-part of application No. 17/899,073, filed on Aug. 30, 2022, now Pat. No. 12,293,796.

(60) Provisional application No. 63/421,647, filed on Nov. 2, 2022.

(58) Field of Classification Search
CPC ... G11C 29/028; G11C 16/0483; G11C 16/08; G11C 2029/0411; G11C 11/5642; G11C 7/04; G11C 16/26
See application file for complete search history.

(56) References Cited

U.S. PATENT DOCUMENTS

| | | | |
|---|---|---|---|
| 7,995,387 | B2 | 8/2011 | Sharon et al. |
| 8,374,026 | B2 | 2/2013 | Sharon et al. |
| 8,782,495 | B2 | 7/2014 | Alrod et al. |
| 9,070,479 | B2 | 6/2015 | Sharon et al. |
| 9,141,475 | B2 | 9/2015 | Alrod et al. |
| 9,431,120 | B1 * | 8/2016 | Tuers ............ G11C 11/5628 |
| 9,697,905 | B2 | 7/2017 | Sharon et al. |
| 9,728,263 | B2 | 8/2017 | Sharon |
| 9,996,281 | B2 | 6/2018 | Sharon et al. |
| 10,379,739 | B1 | 8/2019 | Bazarsky et al. |
| 10,418,097 | B2 | 9/2019 | Avraham et al. |
| 10,475,523 | B2 | 11/2019 | Sharon et al. |
| 10,811,091 | B2 | 10/2020 | Bazarsky et al. |
| 10,991,444 | B1 | 4/2021 | Bazarsky et al. |
| 11,081,474 | B1 | 8/2021 | Hoang et al. |
| 11,150,825 | B2 | 10/2021 | Kashyap et al. |
| 11,244,732 | B2 | 2/2022 | Sharon et al. |
| 2012/0063227 | A1 | 3/2012 | Weingarten et al. |
| 2014/0056066 | A1 | 2/2014 | Baum et al. |
| 2014/0136927 | A1 | 5/2014 | Li |
| 2017/0139590 | A1 | 5/2017 | Hsu et al. |
| 2017/0162268 | A1 | 6/2017 | Chen et al. |
| 2018/0293029 | A1 | 10/2018 | Achtenberg |
| 2018/0293174 | A1 | 10/2018 | Song |
| 2019/0189236 | A1 | 6/2019 | Poliakov et al. |
| 2019/0371402 | A1 | 12/2019 | Lin |
| 2020/0364108 | A1 | 11/2020 | Froelich et al. |
| 2020/0364118 | A1 | 11/2020 | Sun |
| 2021/0241845 | A1 * | 8/2021 | Li ............ G11C 11/54 |
| 2021/0334035 | A1 | 10/2021 | Sheperek et al. |
| 2022/0027721 | A1 | 1/2022 | Zhang et al. |
| 2022/0075561 | A1 | 3/2022 | Peltz et al. |
| 2022/0076738 | A1 | 3/2022 | Bazarsky |
| 2022/0121387 | A1 | 4/2022 | Ha et al. |
| 2022/0121985 | A1 | 4/2022 | Lloyd et al. |
| 2022/0254419 | A1 | 8/2022 | Kim et al. |
| 2025/0118376 | A1 | 4/2025 | Shenoy |

OTHER PUBLICATIONS

U.S. Appl. No. 17/899,073, filed Aug. 30, 2022, entitled "Storage System and Method for Implementation of Symmetric Tree Models for Read Threshold Calibration."

U.S. Appl. No. 18/239,302, filed Aug. 29, 2023, entitled "Data Storage Device and Method for Inferring a Read Threshold Using a Time Tag Determination."

U.S. Appl. No. 18/242,061, filed Sep. 5, 2023, entitled "Data Storage Device and Method for Predicting Future Read Thresholds."

U.S. Appl. No. 18/777,942, filed Jul. 19, 2024, entitled "Data Storage Device and Method for Using Multiple Models for Predicting a Read Threshold."

U.S. Appl. No. 18/800,681, filed Aug. 12, 2024, entitled "Data Storage Device and Method for Combining Prediction Models for Read Threshold Calibration."

U.S. Appl. No. 18/664,514, filed May 15, 2024, entitled "Data Storage Device and Method for Generating Read Threshold Voltages."

U.S. Appl. No. 18/658,074, filed May 8, 2024, entitled "Data Storage Device and Method for Predictive Read Threshold Calibration."

U.S. Appl. No. 18/772,563, filed Jul. 15, 2024, entitled "Data Storage Device and Method for Using Modular Models for Inferring a Read Threshold."

Non-final Office Action mailed Jun. 16, 2025 for U.S. Appl. No. 18/664,514.

Non-final Office Action mailed Jun. 16, 2025 for U.S. Appl. No. 18/242,061.

\* cited by examiner

STORAGE SYSTEM AND METHOD FOR CIRCUIT-BOUNDED-ARRAY-BASED TIME AND TEMPERATURE TAG MANAGEMENT AND INFERENCE OF READ THRESHOLDS

CROSS-REFERENCE TO RELATED APPLICATIONS

This application is (a) a continuation-in-part of U.S. patent application Ser. No. 17/838,481, filed Jun. 13, 2022; (b) a continuation-in-part of U.S. patent application Ser. No. 17/899,073, filed Aug. 30, 2022, which is a continuation-in-part of U.S. patent application Ser. No. 17/838,481, filed Jun. 13, 2022; and (c) claims priority to U.S. provisional patent application No. 63/421,647, filed Nov. 2, 2022, all of which are hereby incorporated by reference.

BACKGROUND

One of the main challenges introduced by NAND process shrinking and three-dimensional stacking is maintaining process uniformity. In addition, memory products need to support a wide range of operational conditions, such as different program/erase cycles, retention times, and temperatures, which leads to increased variability between memory dies, blocks, and pages across the different operational conditions. Due to these variations, the read thresholds used for reading a memory page are not fixed and change significantly as a function of the physical location and the operational conditions, especially for less-mature, new memory nodes. Reading with inaccurate read thresholds can lead to higher bit error rates, which can degrade performance and quality of service due to decoding failures, which require invoking high-latency recovery flows, causing delays and hiccups in performance.

DETAILED DESCRIPTION

The following embodiments generally relate to a storage system and method for inference of optimal read thresholds based on memory parameters and conditions. In one embodiment, a storage system is provided comprising a memory and a controller. The controller is configured to use an inference engine to infer a read threshold based on a plurality of parameters of the memory and use the read threshold in reading a wordline in the memory. In another embodiment, a method is provided that is performed in a storage system comprising a memory. The method comprises generating an inference of a read threshold based on a plurality of parameters of the memory and using the read threshold in reading a wordline in the memory. In yet another embodiment, a storage system is provided comprising a memory, an inference engine configured to provide an inference of a read threshold based on a plurality of parameters of the memory, and means for re-training the inference engine based on a quality of the inference.

In another embodiment, a storage system is provided comprising a memory comprising a plurality of memory dies, wherein each memory die comprises a respective circuit-bounded array; and a storage controller coupled with the memory. The storage controller is configured to perform the following for each of the plurality of memory dies: read a wordline in a memory die; determine a read threshold based on the read wordline; and send the read threshold to the circuit-bounded array in the memory die; wherein each circuit-bounded array is configured to apply a machine-learning-based adjustment to the read threshold.

In another embodiment, a method is provided that is performed in a storage system comprising a memory comprising a plurality of circuit-bounded array (CBAs), wherein each CBA includes a memory die. The following is performed in each CBA: reading a wordline in a time and temperature group in the memory die of the CBA; determining a read threshold based on the read wordline; storing the read threshold in the CBA; and applying a machine-learning-based adjustment to the read threshold.

In yet another embodiment, a storage system is provided comprising: a memory comprising a circuit-bounded array including a memory die; and means, located in the circuit-bounded array, for: reading a wordline in the memory die; determining a read threshold based on the read wordline; and applying a machine-learning-based adjustment to the read threshold on-the-fly before a target wordline in the memory die is read. Other embodiments are provided and can be used alone or in combination.

Figure 1A:
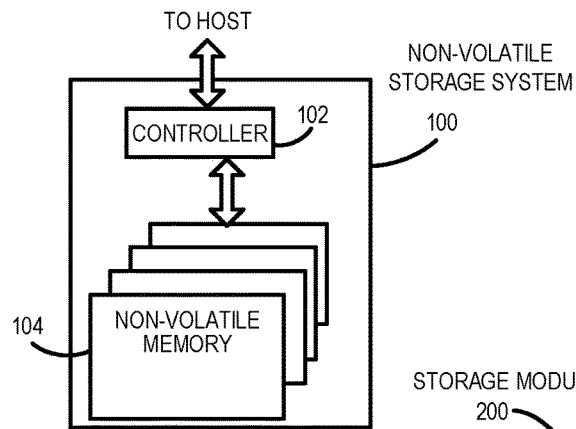
FIG. 1A is a block diagram of a non-volatile storage system of an embodiment.
Figure 1B:
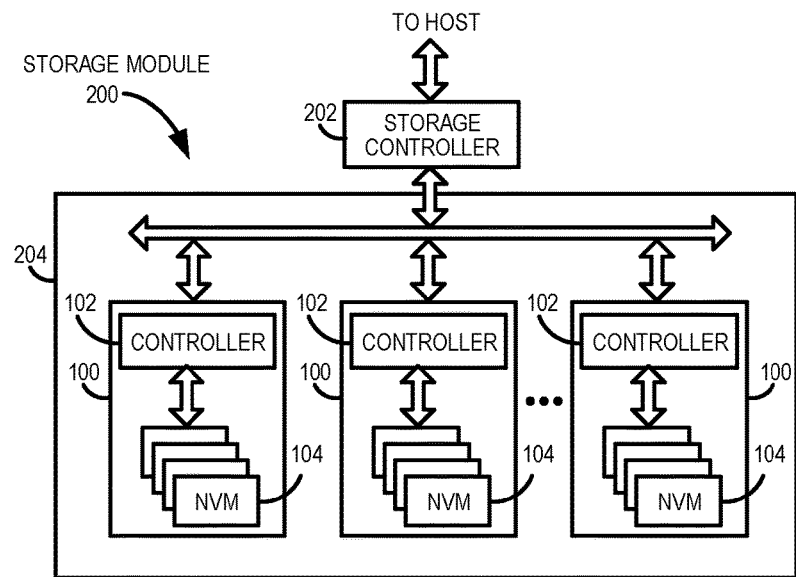
FIG. 1B is a block diagram illustrating a storage module of an embodiment.
Figure 1C:
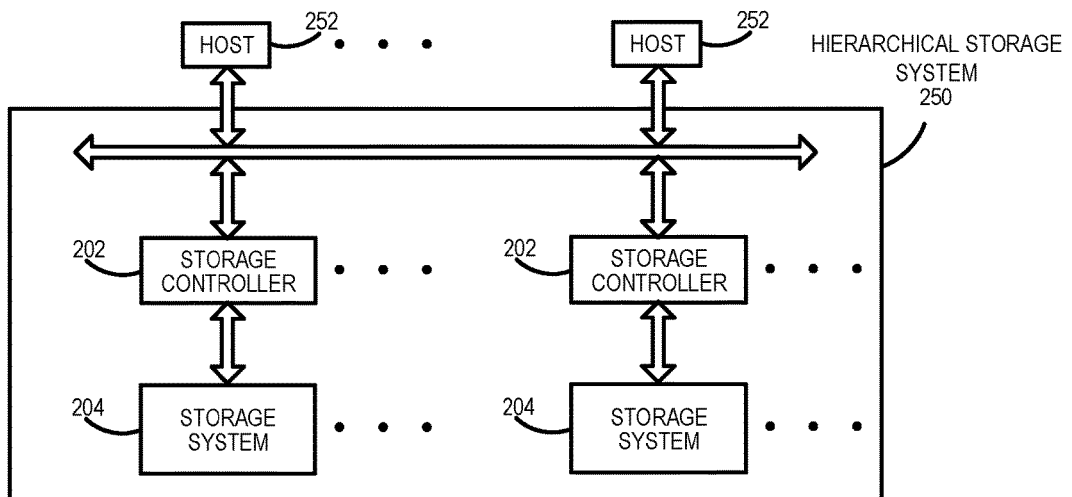
FIG. 1C is a block diagram illustrating a hierarchical storage system of an embodiment.

Turning now to the drawings, storage systems suitable for use in implementing aspects of these embodiments are shown in FIGS. 1A-1C. FIG. 1A is a block diagram illustrating a non-volatile storage system 100 (sometimes referred to herein as a storage device or just device) according to an embodiment of the subject matter described herein. Referring to FIG. 1A, non-volatile storage system 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a non-volatile memory controller (e.g., a flash, resistive random-access memory (ReRAM), phase-change memory (PCM), or magneto-resistive random-access memory (MRAM) controller)) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a non-volatile memory controller is a device that manages data stored on non-volatile memory and communicates with a host, such as a computer or electronic device. A non-volatile memory controller can have various functionality in addition to the specific functionality described herein. For example, the non-volatile memory controller can format the non-volatile memory to ensure the memory is operating properly, map out bad non-volatile memory cells, and allocate spare cells to be substituted for future failed cells. Some part of the spare cells can be used to hold firmware to operate the non-volatile memory controller and implement other features. In operation, when a host needs to read data from or write data to the non-volatile memory, it can communicate with the non-volatile memory controller. If the host provides a logical address to which data is to be read/written, the non-volatile memory controller can convert the logical address received from the host to a physical address in the non-volatile memory. (Alternatively, the host can provide the physical address.) The non-volatile memory controller can also perform various memory management functions, such as, but not limited to, wear leveling (distributing writes to avoid wearing out specific blocks of memory cells that would otherwise be repeatedly written to) and garbage collection (after a block is full, moving only the valid pages of data to a new block, so the full block can be erased and reused). Also, the structure for the "means" recited in the claims can include, for example, some or all of the structures of the controller described herein, programmed or manufactured as appropriate to cause the controller to operate to perform the recited functions.

Non-volatile memory die 104 may include any suitable non-volatile storage medium, including ReRAM, MRAM, PCM, NAND flash memory cells and/or NOR flash memory cells. The memory cells can take the form of solid-state (e.g., flash) memory cells and can be one-time programmable, few-time programmable, or many-time programmable. The memory cells can also be single-level (one-bit per cell) cells (SLC) or multiple-level cells (MLC), such as two-level cells, triple-level cells (TLC), quad-level cell (QLC) or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, storage system 100 may be a card-based system, such as a secure digital (SD) or a micro secure digital (micro-SD) card (or USB, SSD, etc.). In an alternate embodiment, storage system 100 may be part of an embedded storage system.

Although, in the example illustrated in FIG. 1A, non-volatile storage system 100 (sometimes referred to herein as a storage module) includes a single channel between controller 102 and non-volatile memory die 104, the subject matter described herein is not limited to having a single memory channel. For example, in some storage system architectures (such as the ones shown in FIGS. 1B and 1C), 2, 4, 8 or more memory channels may exist between the controller and the memory device, depending on controller capabilities. In any of the embodiments described herein, more than a single channel may exist between the controller and the memory die, even if a single channel is shown in the drawings.

FIG. 1B illustrates a storage module 200 that includes plural non-volatile storage systems 100. As such, storage module 200 may include a storage controller 202 that interfaces with a host and with storage system 204, which includes a plurality of non-volatile storage systems 100. The interface between storage controller 202 and non-volatile storage systems 100 may be a bus interface, such as a serial advanced technology attachment (SATA), peripheral component interconnect express (PCIe) interface, or double-data-rate (DDR) interface. Storage module 200, in one embodiment, may be a solid-state drive (SSD), or non-volatile dual in-line memory module (NVDEVIM), such as found in server PC or portable computing devices, such as laptop computers, and tablet computers.

FIG. 1C is a block diagram illustrating a hierarchical storage system. A hierarchical storage system 250 includes a plurality of storage controllers 202, each of which controls a respective storage system 204. Host systems 252 may access memories within the storage system via a bus interface. In one embodiment, the bus interface may be a Non-Volatile Memory Express (NVMe) or fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
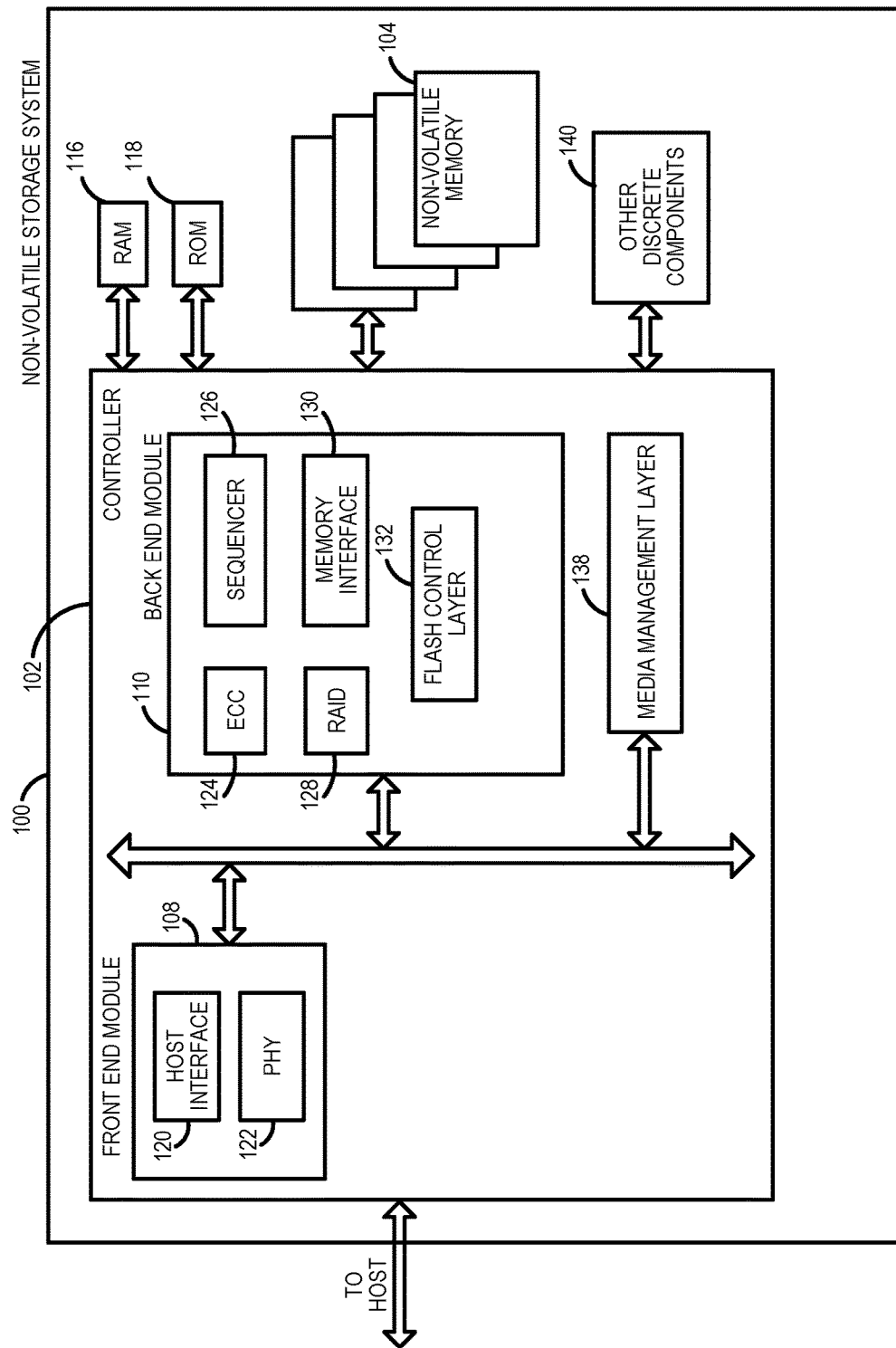
FIG. 2A is a block diagram illustrating components of the controller of the non-volatile storage system illustrated in FIG. 1A according to an embodiment.

FIG. 2A is a block diagram illustrating components of controller 102 in more detail. Controller 102 includes a front end module 108 that interfaces with a host, a back end module 110 that interfaces with the one or more non-volatile memory die 104, and various other modules that perform functions which will now be described in detail. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example. The controller 102 may sometimes be referred to herein as a NAND controller or a flash controller, but it should be understood that the controller 102 can be used with any suitable memory technology, example of some of which are provided below.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, serially attached small computer system interface (SAS), Fibre Channel, universal serial bus (USB), PCIe, and NVMe. The host interface 120 typically facilitates transfer for data, control signals, and timing signals.

Back end module 110 includes an error correction code (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

The storage system 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
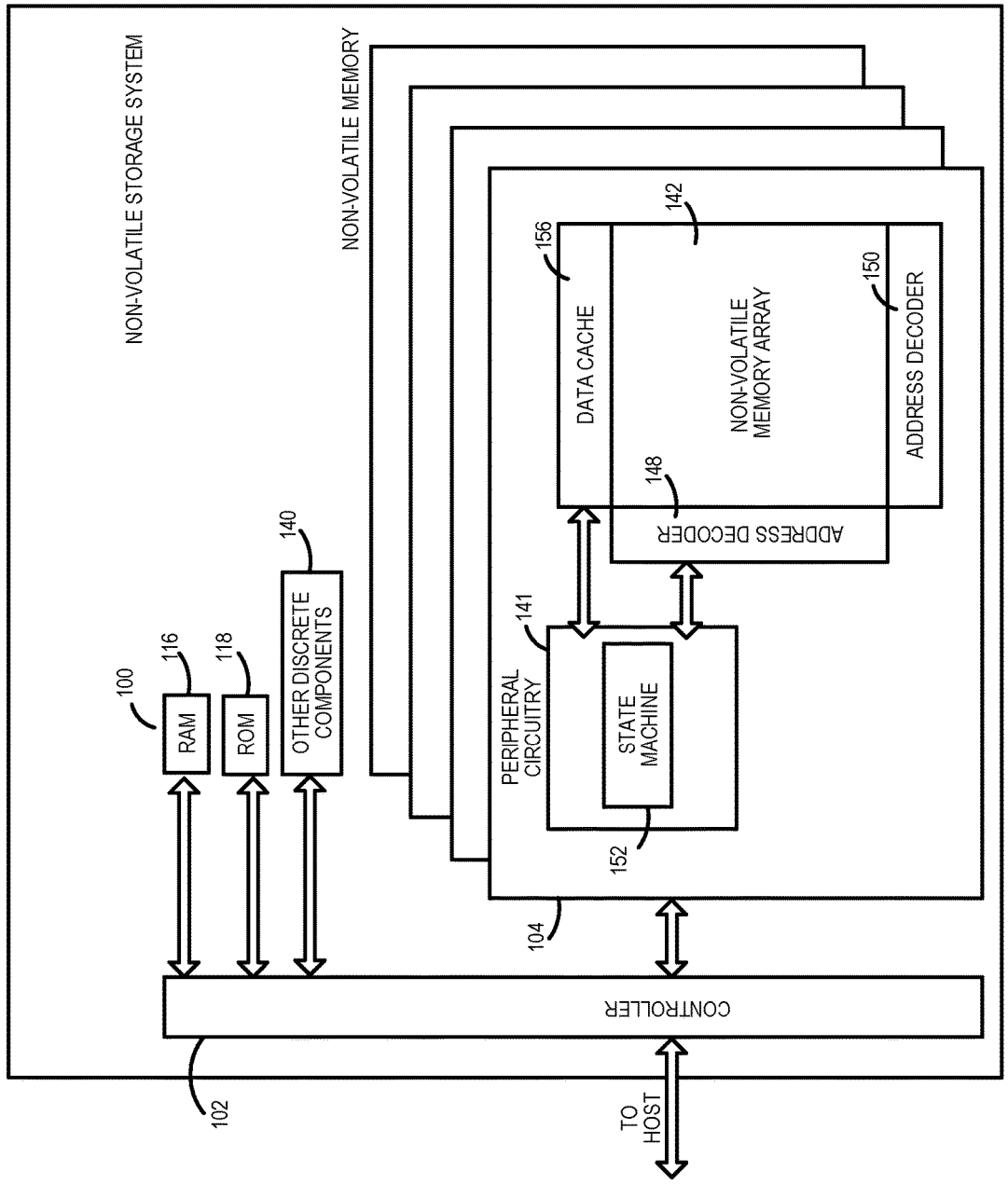
FIG. 2B is a block diagram illustrating components of the non-volatile storage system illustrated in FIG. 1A according to an embodiment.

FIG. 2B is a block diagram illustrating components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including ReRAM, MRAM, PCM, NAND flash memory cells and/or NOR flash memory cells in a two dimensional and/or three dimensional configuration. Non-volatile memory die 104 further includes a data cache 156 that caches data. Peripheral circuitry 141 includes a state machine 152 that provides status information to the controller 102.

Returning again to FIG. 2A, the flash control layer 132 (which will be referred to herein as the flash translation layer (FTL) or, more generally, the "media management layer," as the memory may not be flash) handles flash errors and interfaces with the host. In particular, the FTL, which may be an algorithm in firmware, is responsible for the internals of memory management and translates writes from the host into writes to the memory 104. The FTL may be needed because the memory 104 may have limited endurance, may only be written in multiples of pages, and/or may not be written unless it is erased as a block of memory cells. The FTL understands these potential limitations of the memory 104, which may not be visible to the host. Accordingly, the FTL attempts to translate the writes from host into writes into the memory 104.

The FTL may include a logical-to-physical address (L2P) map (sometimes referred to herein as a table or data structure) and allotted cache memory. In this way, the FTL translates logical block addresses ("LBAs") from the host to physical addresses in the memory 104. The FTL can include other features, such as, but not limited to, power-off recovery (so that the data structures of the FTL can be recovered in the event of a sudden power loss) and wear leveling (so that the wear across memory blocks is even to prevent certain blocks from excessive wear, which would result in a greater chance of failure).

Figure 3:
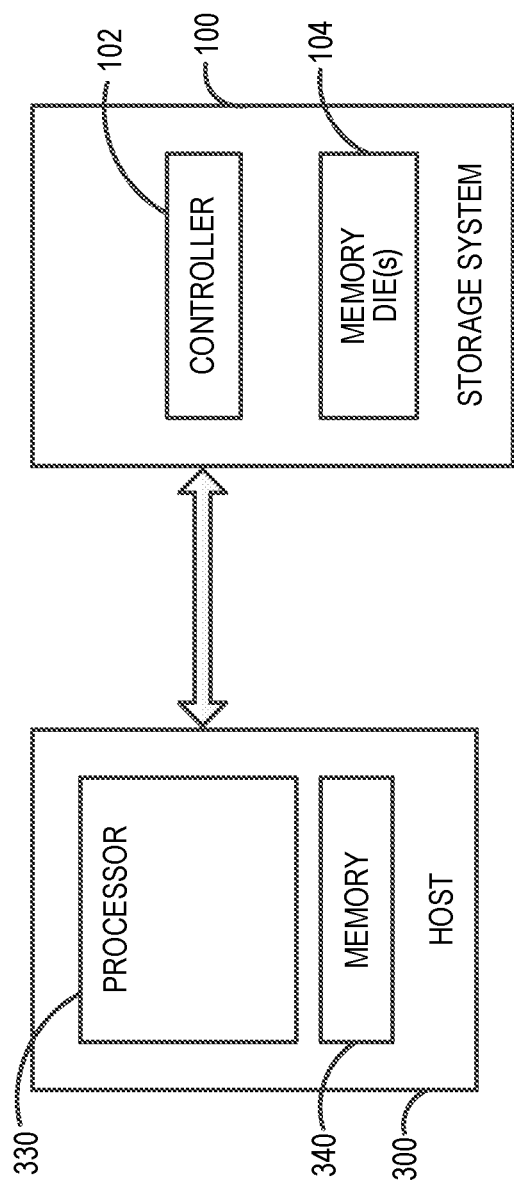
FIG. 3 is a block diagram of a host and storage system of an embodiment.

Turning again to the drawings, FIG. 3 is a block diagram of a host 300 and storage system (sometimes referred to herein as a device) 100 of an embodiment. The host 300 can take any suitable form, including, but not limited to, a computer, a mobile phone, a digital camera, a tablet, a wearable device, a digital video recorder, a surveillance system, etc. The host 300 comprises a processor 330 that is configured to send data (e.g., initially stored in the host's memory 340 (e.g., DRAM)) to the storage system 100 for storage in the storage system's memory 104 (e.g., non-volatile memory dies). While the host 300 and the storage system 100 are shown as separate boxes in FIG. 3, it should be noted that the storage system 100 can be integrated in the host 300, the storage system 100 can be removably connected to the host 300, and the storage system 100 and host 300 can communicate over a network. It should also be noted that the memory 104 can be integrated in the storage system 100 or removably connected to the storage system 100.

As mentioned above, one of the main challenges introduced by NAND process shrinking and three-dimensional stacking is maintaining process uniformity. In addition, memory products need to support a wide range of operational conditions, such as different program/erase cycles, retention times, and temperatures, which leads to increased variability between memory dies, blocks, and pages across the different operational conditions. Due to these variations, the read thresholds (RT) used for reading a memory page are not fixed and change significantly as a function of the physical location and the operational conditions, especially for less-mature, new memory nodes. Reading with inaccurate read thresholds can lead to higher bit error rates (BERs), which can degrade performance and quality of service (QoS) due to decoding failures, which require invoking high-latency recovery flows, causing delays and hiccups in performance.

The challenge of maintaining optimal read thresholds is especially important for enterprise memory systems for which the quality-of-service requirements are very strict, and for mobile, Internet of Things (IoT), and automotive memory systems for which the required range of operational conditions is wide and the frequency of condition changes (e.g. temperature) may be high. The problem is even more difficult during transitions to new, less-mature memory nodes.

Current solutions for read threshold calibration, such as bit error rate (BER) Estimation Scan (BES) and Valley Search (VS), are high-latency operations aimed at optimizing read thresholds for a specific wordline, which is good for rare read recovery flows in cases of failure to decode the data but is not that suitable for frequent operations in case of frequent read threshold changes. Hence, in order to cope with this issue, flash memory systems can implement read threshold management schemes that try to track read threshold changes in the background via a maintenance process to ensure that appropriate read thresholds are used when the host issues a read command.

One approach is to track the read thresholds per groups of blocks that share the same conditions. More specifically, blocks that are written roughly at the same time and temperature are grouped into time and temperature (TT) groups. Read thresholds are tracked for each TT group, usually acquired on some representative wordline from a block within the group. When the host performs a read operation, the read thresholds associated with the TT group corresponding to the read block are used, wherein additional adaptation to the read thresholds, according to the specific read wordline, may be performed based on pre-calibrated wordline zoning tables.

Figure 4:
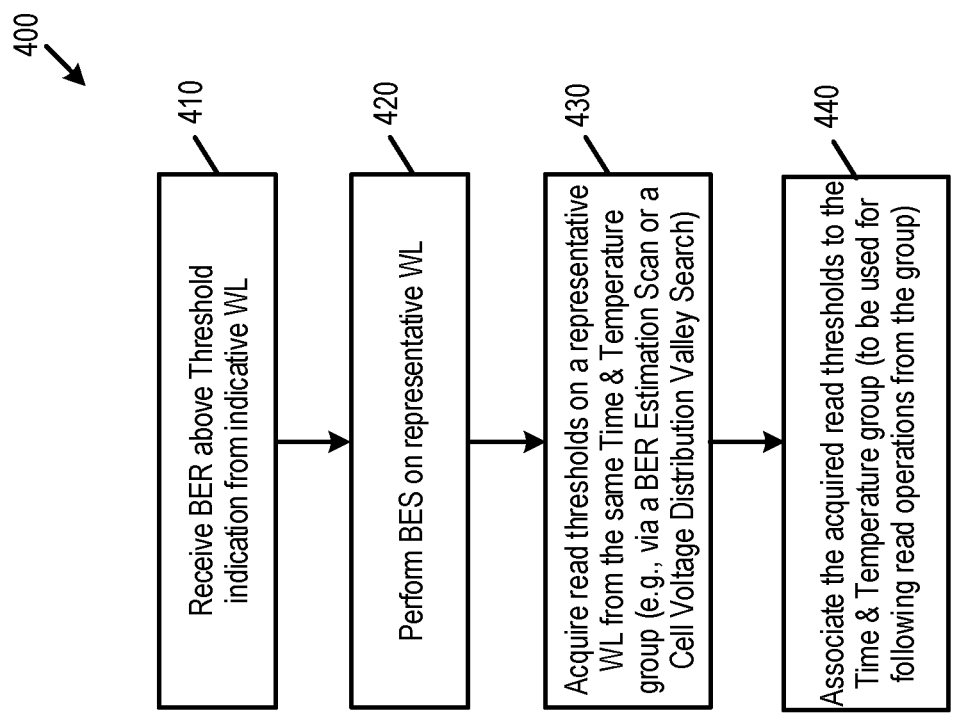
FIG. 4 is a flow chart of a read threshold calibration method of an embodiment.

Unfortunately, existing read threshold management schemes can be suboptimal and may not adequately track the read thresholds under frequently-changing conditions and high variations between memory pages. For example, as noted above, blocks can be grouped according to programming time and temperature, and a maintenance process can track the appropriate read threshold per group of blocks by finding the optimal read threshold of a representative wordline from the block (e.g., via BER Estimation Scan or Valley Search). An example of this technique is shown in the flow chart 400 of FIG. 4. As shown in FIG. 4, in this method, the storage system receives a bit error rate above a threshold indication from an indicative wordline (act 410). The storage system 100 then acquires read thresholds on a representative wordline from the same time and temperature group (e.g. via a BER Estimation Scan or a Cell Voltage Distribution Valley Search) (act 420). Next, the storage system 100 associates the acquired read thresholds to the time and temperature group (to be used for following read operations from the group) (act 430) and adjusts the read threshold based on a wordline indexing zone when reading other wordlines (act 440).

So, in this technique, predefined corrections can be applied to the read thresholds of the representative wordline based on the wordline number being read (using a wordline zoning table). In case that a certain wordline shows an elevation in bit error rate or that decoding of the wordline's data fails, a BER Estimation Scan or Valley Search can be applied in the foreground to calibrate the wordline's read threshold as part of a read error handling (REH) flow. The indicative wordline is usually chosen on the edge of the block, such that BER elevation is caught quickly. However, this approach can be suboptimal and result in performance hiccups and quality-of-service violations under stress conditions (such as rapid temperature changes).

Other table-based methods, which set the read thresholds based on a predefined table as a function of various memory parameters (such as Program/Erase Count (PEC), WL #, . . . ) can be used. However, due to practical table size limitations, such methods can take into account only a limited small number of parameters or, alternatively, assume a simplistic model, wherein each factor (e.g., wordline number, program-erase count, temperature, die dependency, etc.) affects the read threshold in an independent and additive manner. In reality, the interactions may be more involved and can be more complex and non-linear.

The following embodiments can be used to infer optimal read thresholds from all available information, including TT group information, temperature information, BER information, program-erase count (PEC) information, and physical page location. In one embodiment, machine-learning methodologies are used to train a low-complexity inference model under all relevant conditions in order to learn the intricate and non-linear dependencies of the read thresholds on each of the available features. Using this approach, the storage system can fine tune the TT group read thresholds based on additional information sources, providing consistent near-optimal read thresholds. This, in turn, can reduce the BER levels of read data, which improves performance and quality of service, reduces power consumption, and reduces decoder failure events rate.

In one embodiment, the controller 102 of the storage system 100 infers an optimal read threshold based on a non-linear function of multiple inputs that reflect current memory and data conditions. Machine learning (ML) methodologies can be used derive a read threshold inference function that makes use of all available information sources, including latest TT information of the block, BER information, temperature information (prog temp/TT acquiring temp/current read temp), PEC information, and physical location information (WL #, String #, Plane #, Edge blocks, Die X/Y info, . . . etc.). That way, improved read thresholds are used, reducing the BER levels of read data. In one implementation, the controller 102 uses a low-complexity hardware and firmware implementation of an inference function that selects appropriate engineered features and appropriate machine learning models. Of course, other implementations are possible.

As mentioned above, some methods to set the read thresholds are suboptimal and do not use all the available information sources (e.g., TT group information, NAND condition, temperature, physical address, etc.) to infer the read thresholds in an optimal and holistic manner. More specifically, the optimal read threshold for a specific page under a specific memory condition may be correlated to multiple parameters that may be available to the controller 102 during operation, such as, but not limited to: information on the time and temperature group of blocks to which the read block belongs: read thresholds acquired on representative WLx, BER information of representative WLx (SW/BER/BER1→0/BER0→1), temperature at which WLx read thresholds were acquired, time at which WLx read thresholds were acquired, read thresholds acquired on representative WLy, BER information of representative WLy (SW/BER/BER1→0/BER0→1), temperature at which WLy read thresholds were acquired, time at which WLx read thresholds were acquired, program temperature of the block being read ("Prog-Temp"), current read temperature ("Read-Temp"), the difference between Prog-Temp and current Read-Temp (also called "X-Temp"), PEC of the block being read, a data-retention level of the block being read (i.e., the TimePool index of the block, which is a function of the time that elapsed since the block was programmed, normalized by temperature), BER information of previous WLs/pages to the page being read (which may be available under sequential read scenarios), default read thresholds of the die, physical address information of the read page, WL/page #, string #, plane #, block location (e.g., edge/non-edge block), and die information (e.g., X/Y location on wafer).

Theoretically, one may use a large multi-dimensional table indexed by all these parameters, storing the optimal read levels per case; however, this is not feasible as it requires an exponentially large table. Instead, one embodiment applies machine-learning-based methodologies in order to learn a low-complexity inference model for optimal read thresholds based on all available parameters (or the most-informative and/or easily-available ones).

Figure 5A:
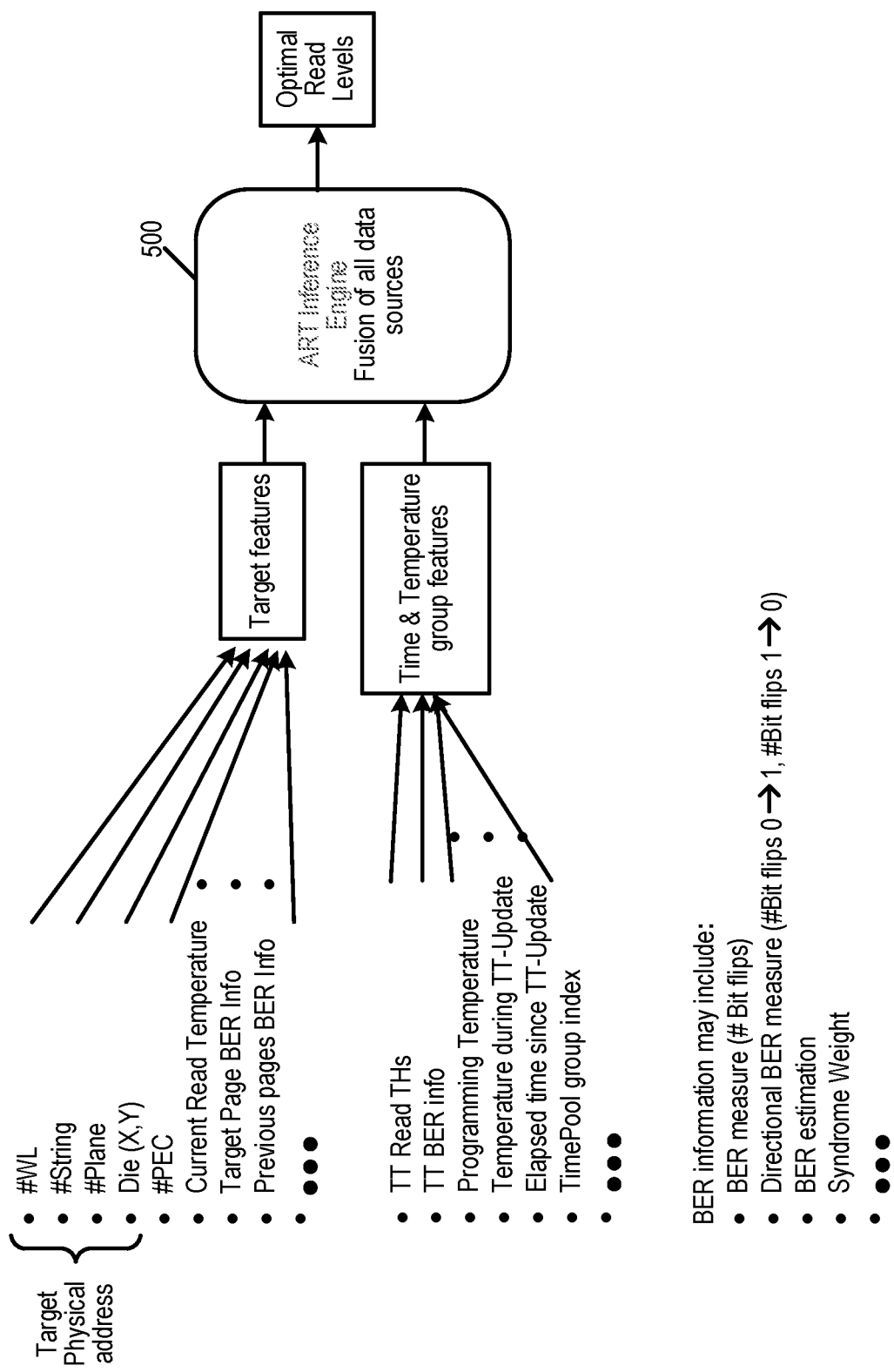
FIG. 5A is a diagram of an inference engine of an embodiment.

FIG. 5A is a diagram of an inference engine 500 of an embodiment that illustrates this approach. The model training can be done either offline or online, or in combination (e.g., basic offline training with online fine tuning and re-training). Regarding off-line training, one of the major problems of any machine learning project is obtaining a large labeled data set (i.e., obtaining "Big Data" to train a model). Fortunately, for the problem at hand, this task is fairly simple. A large amount of state-by-state cell-voltage-distribution ("SbS CVD") measurements can be obtained at different NAND conditions, and, based on those measurement, both the features (as listed above) and the optimal read thresholds for each measurement can be obtained that will serve as the label. Then, the machine-learning model can be trained to couple non-linearly between the input features (including the target page parameters and the TT group parameters) and the optimal read thresholds. During device regular operation, the machine-learning model can be applied at regular read operations or read-error-handling (REH) can be used. As demonstrated below, a compact and highly simple machine-learning model can provide significant reduction in the resulting failed bit count (FBC) comparing the default read thresholds. The relevant model parameters may be kept in ROM or SRAM or in the non-volatile memory 104 (e.g. in SLC blocks). However, very simple models, requiring very small RAM/ROM, can provide excellent results.

Figure 5B:
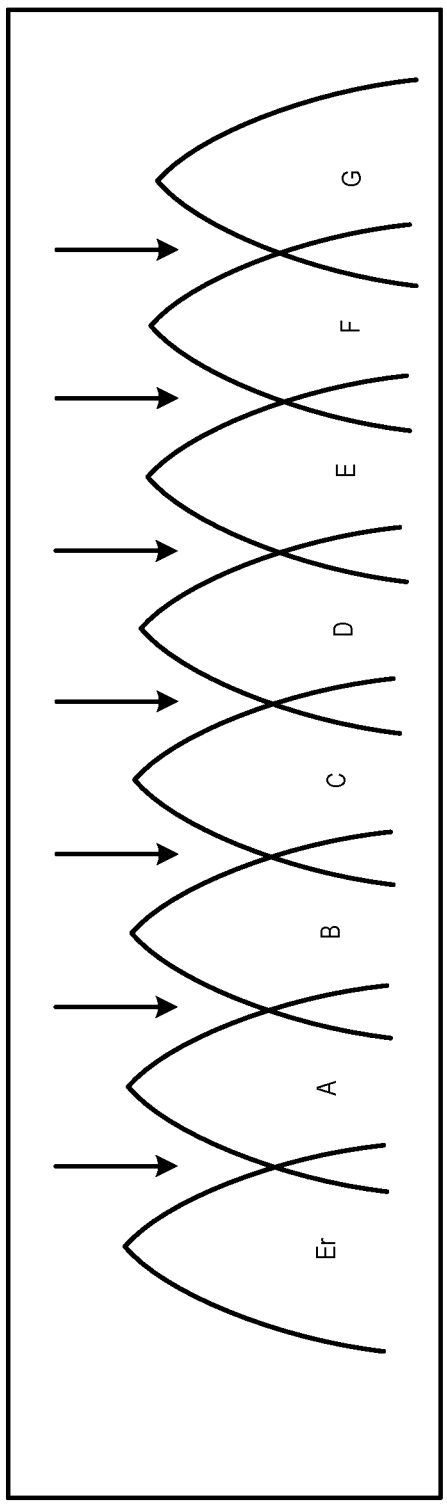
FIG. 5B is a graph of an embodiment from which read thresholds can be derived

For example, in performing data collection and building a training test, State-by-State Cell Voltage Distributions (SbS CVD) can be collected for various conditions (PEC, memory bake times, program/read temperatures, etc.). FIG. 5B is a graph showing a SbS CVD based on which optimal read thresholds and other relevant information (such as the BER information for any set of read thresholds (optimal/BES/VS/Default)) can be derived. From each SbS-CVD, the optimal read thresholds can be determined, as well as BER statistics when reading at any read level. This allows a training data set to be built. For example, for an arbitrary WLj in Block k, an optimal read level label can be associated with a number of features, including, but not limited to: BES/VS read levels on representative wordline/s taken from a block m with similar conditions (except potentially its read temperature to emulate TT management scheme used by the system), TT read thresholds acquiring temperature (=read temperature of block m), elapsed time since acquiring (=additional bake time of block m), Block k PEC, elapsed time normalized by temperature, read temperature of Block k, program temperature of Block k, and BER information of various pages (possibly including target page in WLj of block k, previous pages in block k, the selected representative pages in block m, . . . ), physical address of target WLj (possibly including the WL index j, the plane #, the string #, edge block indication, die X/Y information).

Regarding the on-line training approach, that approach can include continuous data collection during the device's lifetime (of similar SbS-CVD data or other available data), at which the machine-learning model can either be trained or modified based on this dynamic data base. On-line training may continue during the life of the device. and model tuning may be performed.

Figure 6:
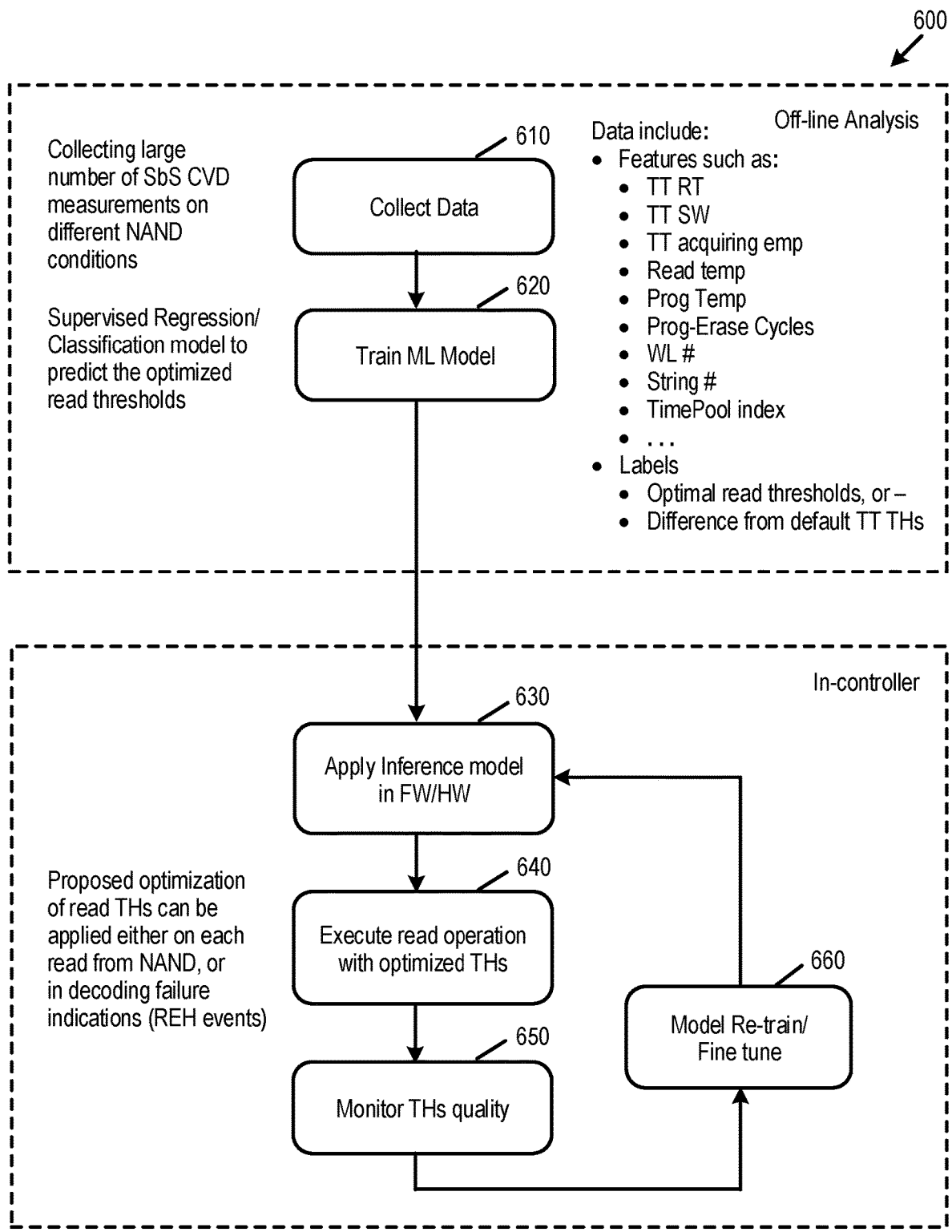
FIG. 6 is a flow chart of a method of an embodiment for inference of read thresholds based on memory parameters and conditions.

The approach in this embodiment can be much more agile and scalable, where additions and modifications of conditions are not required. This approach is illustrated in the flow chart 600 of FIG. 6. As shown in FIG. 6, first data is collected (act 610) and the machine-learning model is trained (act 620). These acts can be performed using an off-line analysis. Then, the controller 102 can apply an inference model (act 630), execute read operations within the optimized read thresholds (THs) (act 640), monitor the quality of the read thresholds (act 650), and retrain/fine-tune the model (act 660).

These embodiments can be generalized for optimization and inference of one or more of the following parameters based on the same or similar features that impact storage system's performance: read thresholds, program/verify thresholds, log-likelihood ratio (LLR) tables, soft-bit read thresholds or soft-bit delta values.

One embodiment is based on a hardware implementation of the inference engine, such that the inference is performed as part of the mainstream read operation from the host 300. In this case, the inference engine can have direct access to the memories that hold the features relevant for the current read operation (e.g., the TT tables, PEC table, temperature sensors, physical addresses, etc.). A low-level RISC can prepare a descriptor with the relevant features for the current read operation. In this way, the inference engine can provide optimized read levels for each read operation.

Figure 7:
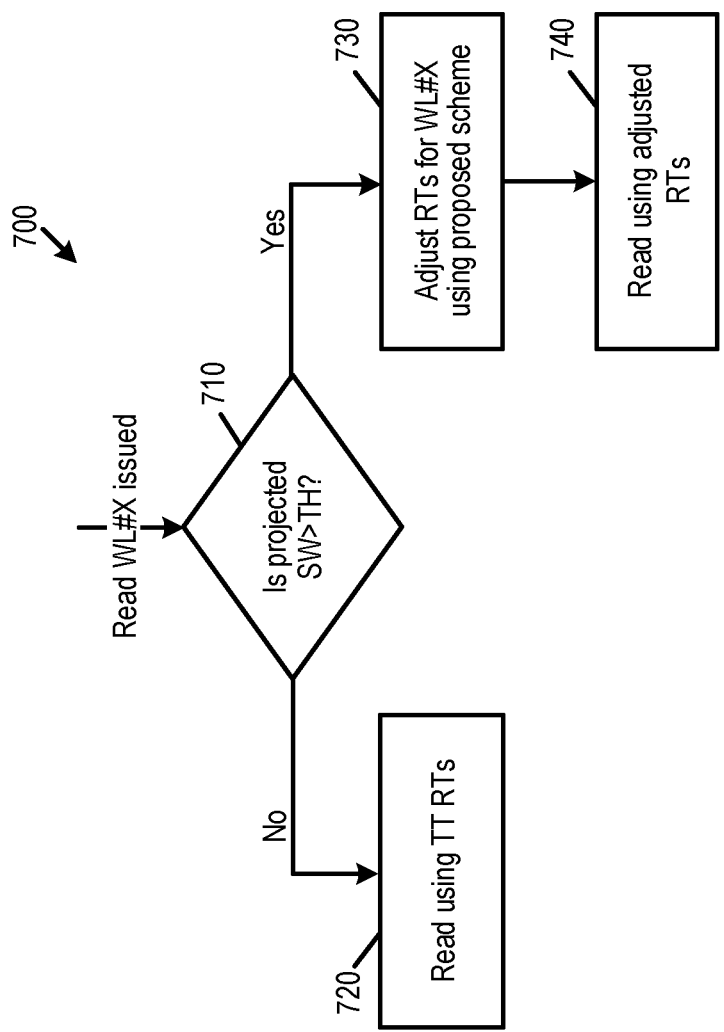
FIG. 7 is a flow chart of a selective usage method of an embodiment.

In another embodiment, if the inference is based on a firmware implementation or if the latency of accessing all the relevant features is prohibitive for a mainstream usage, selective usage of the inference engine may be applied. FIG. 7 is a flow chart 700 that illustrates selective usage. As shown in FIG. 7, when a read is issued, the controller 102 checks if the estimated BER (e.g. via ECC Syndrome Weight (SW) calculation) is greater than the threshold (act 710), which is indicative of whether the conditions in which the TT read threshold was acquired are similar to the current ones. If the SW is not greater than the threshold, the current read thresholds are used to read (act 720). However, if the SW is greater than the threshold, the read thresholds are adjusted (act 730) and are used to read (act 740).

Figure 8:
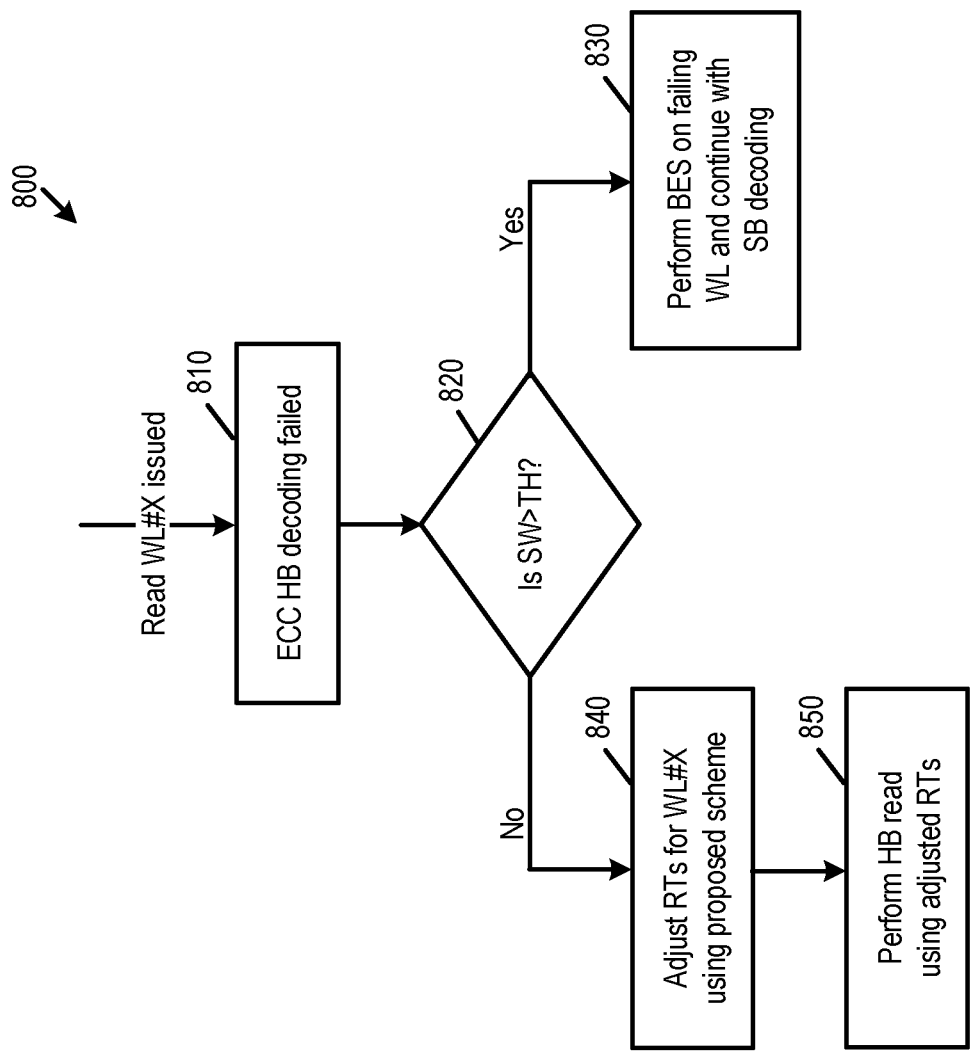
FIG. 8 is a flow chart of a method of an embodiment used as part of a read error handling flow.

In another alternative, these embodiments can be used as part of a Read Error Handling (REH) flow. For example, if the decoder has failed to decode after regular hard bit (HB) read, the read threshold inference module can be applied on the failing wordline, followed by another HB read. The conventional REH flow performs a lengthy read thresholds calibration operation (e.g., via BES or VS) directly after the HB decoding failure, and the proposed extra step may reduce the overall read latency significantly. This alternative is shown in the flow chart 800 in FIG. 8. As shown in FIG. 8, in this embodiment, after a read command is issued for a wordline, the controller 102 detects an ECC HB decoding failure (act 810) and determines whether the SW is greater than the read threshold (act 820). If it is, BES/VS is performed on the failing wordline (act 830). If it is not, the read threshold for the wordline is adjusted based on the inference function/engine (act 840) and an HB read is performed using the adjusted read threshold (act 850).

Figure 9:
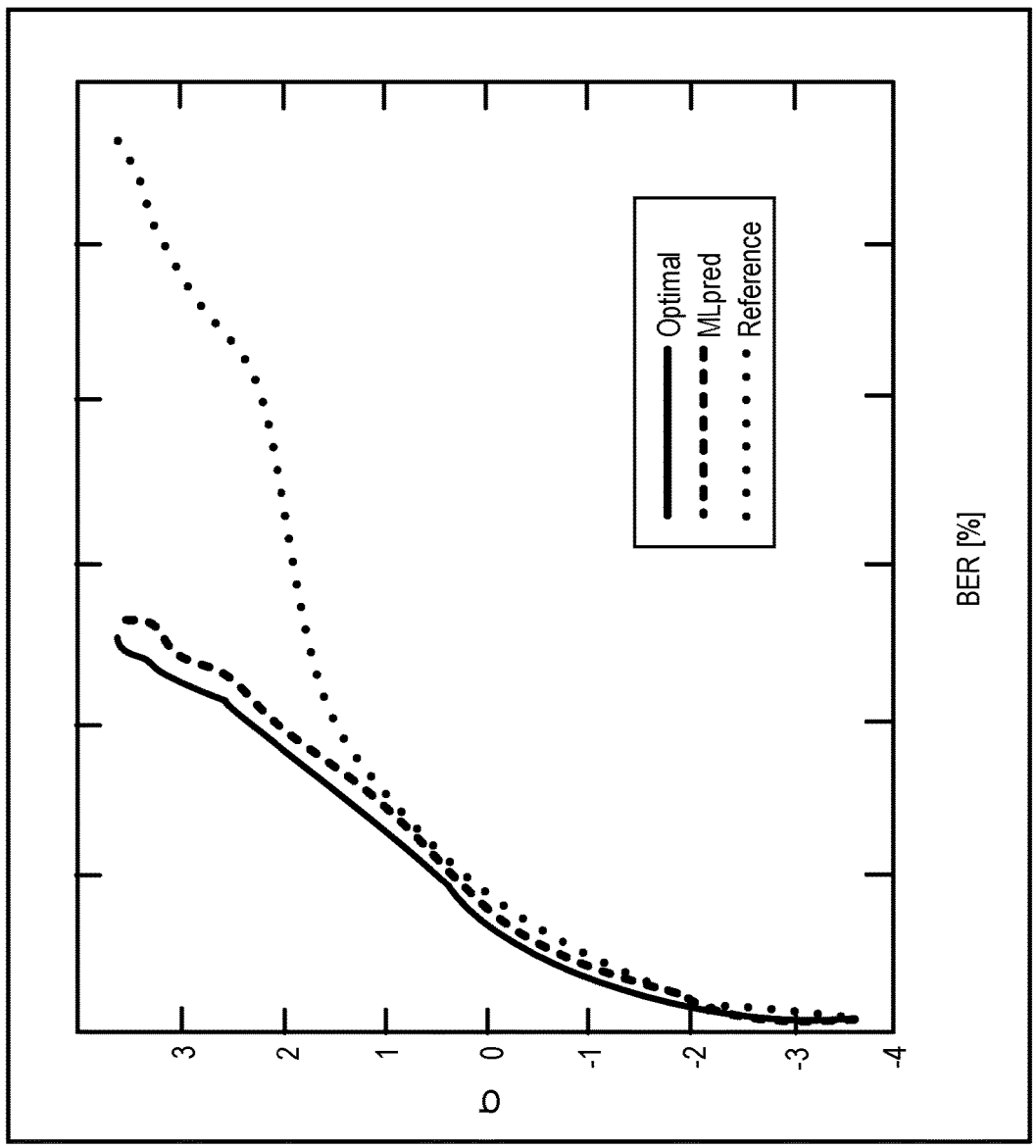
FIG. 9 is a graph of logical page results of an embodiment.

FIG. 9 is a Sigma-Plot graph for averaged FBC for different test conditions. The three curves represent a reference, the optimal read threshold, and results generated using a machine-learning-based inference engine. The results show significant gain when using the machine-learning-based inference engine as compared to the reference. Large gains are especially observed for samples where the TT read threshold acquiring temperature is different than current read temperature. In that situation, the TT read threshold becomes significantly sub-optimal while the machine-learning-based inference engine provides effective compensation for the temperature difference. It should be understood that this information is being provided for illustration purposes and is not intended as a limitation, in any way, on the claims.

There are several advantages associated with these embodiments. For example, using a machine-learning-based approach can provide significant improvement in read threshold accuracy versus a reference method, as shown above. The improved read thresholds result in reduced BER, which can improve NAND latency and throughput, improve power consumption, reduce error rates, and improve quality of service.

Many alternatives can be used with these embodiments. For example, some of the embodiments described above rely on a controller-located inference module that is based on a non-linear function of multiple inputs that reflect current memory and data conditions. In one alternate embodiment, a circuit-bounded array (CBA) is used, as it has properties that may be a better fit for the inference module that performs distributed read threshold calculations per each die locally. The following paragraphs provide a brief overview of a CBA followed by an example of how a CBA can be used for time and temperature tag management and inference of read thresholds.

Figure 10:
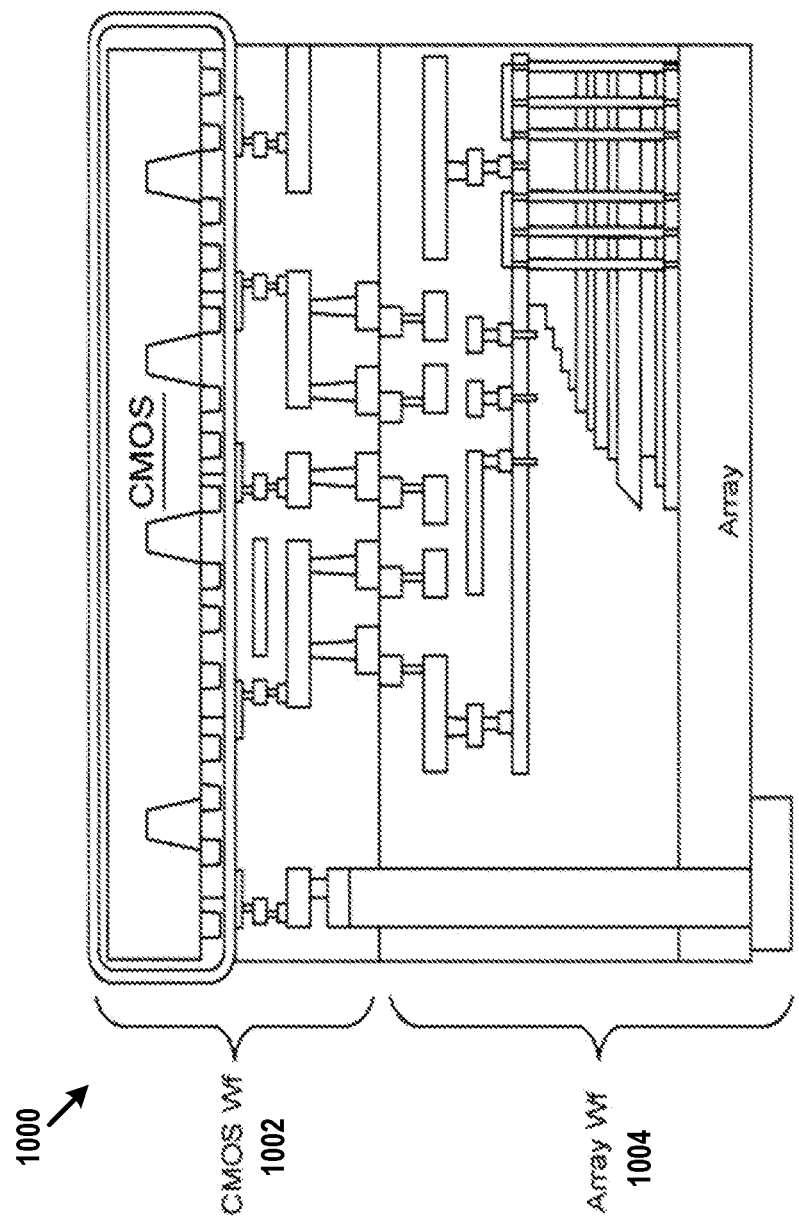
FIG. 10 is an illustration of a circuit-bounded array (CBA) of an embodiment.

Circuit-bounded array (CBA) architecture is a developing technology that separates the complementary metal oxide semiconductor (CMOS) logic typically performed under a memory array in a "Circuit Under the Array" (CUA) architecture and implements it in a separate CMOS chip, which allows for faster operations. FIG. 10 is an example of CBA architecture 1000 of an embodiment. As shown in FIG. 10, the CBA architecture 1000 of this embodiment comprising one or more CMOS chips coupled to one or more arrays via one or more connection units, where the arrays correspond to one or more memory locations of the non-volatile memory 104, such as a first die of the plurality of dies of the memory 104. The CMOS device and the associated architecture may be referred to as a CMOS work function (WF) 1002. Furthermore, the array and the associated architecture may be referred to as an array WF 1004.

In one embodiment, the CMOS WF 1002 is a "Circuit Above the Array" (CAA) device. Because the CMOS device is separate from the array WF 1004, the CMOS logic may be performed faster than a CuA device. Each CAA device of the plurality of CAA devices can include an error correction code (ECC) module configured to encode and decode error correction codes to and from each of the relevant memory dies.

Figure 11A:
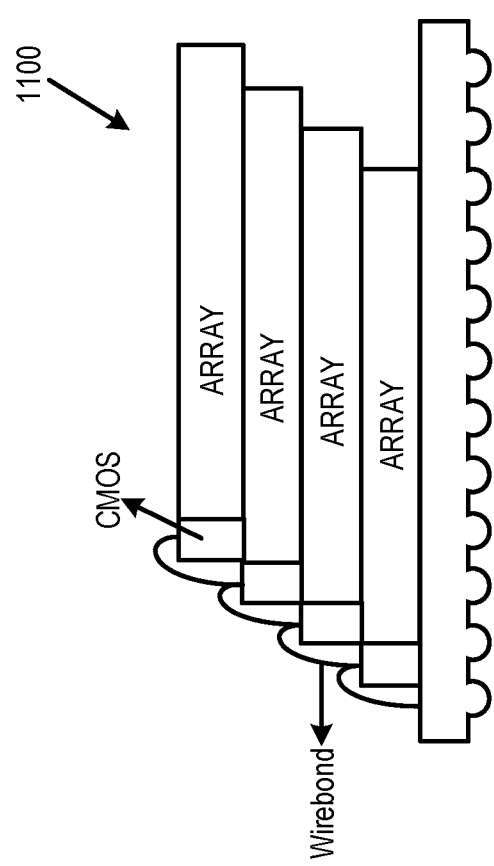
FIGS. 11A, 11B, and 11C are examples of die-stacking configurations of various embodiments.
Figure 11B:
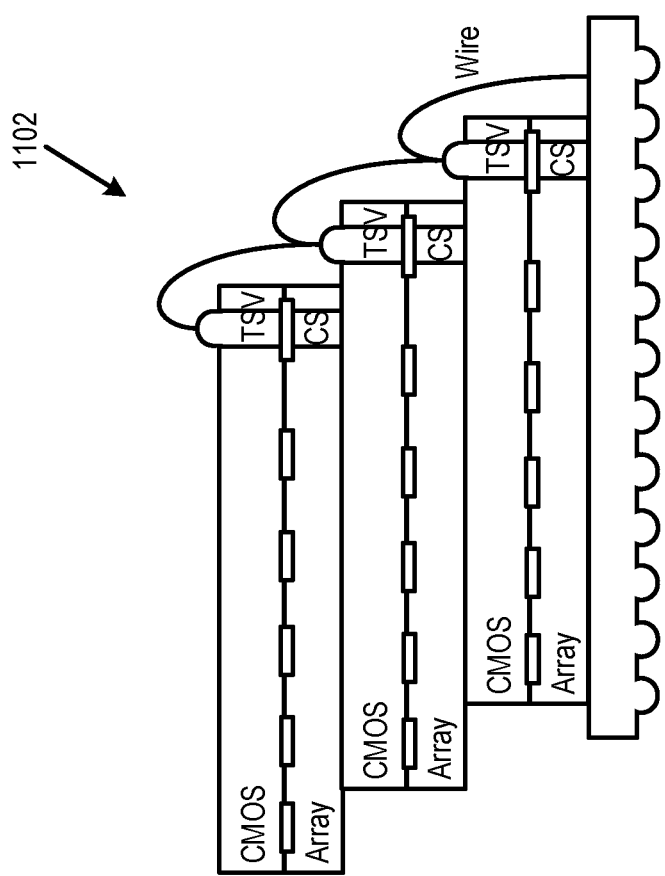
Figure 11C:
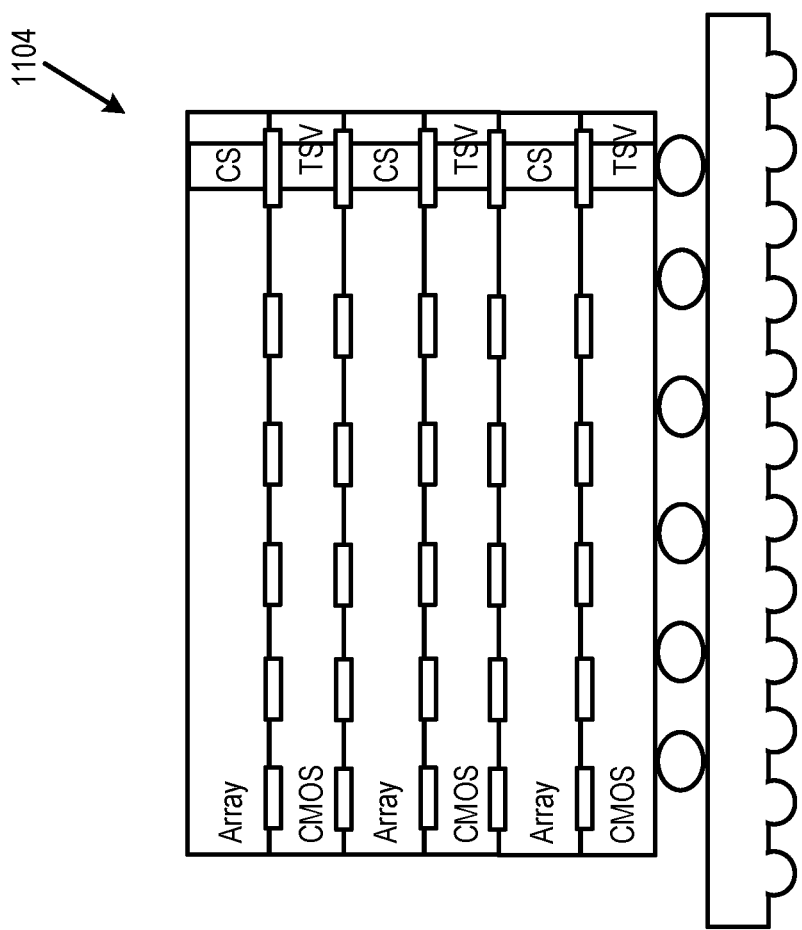

As mentioned above, in CBA and CAA architectures, the CMOS and array portions are placed in separate wafers using separate fabrication processes. This allows for better overall input-output (TO) performance, power, and cost, as well as enabling new ways to increase three-dimensional stacking. For example, in conventional architectures 1100 (see FIG. 11A) wherein the CMOS and memory array are on the same wafer, the wafers can be stacked in an offset fashion to allow bond wires to connect to the CMOS portion of each wafer and then to the substrate. As shown in the stacking configuration 1102 of FIG. 11B, offset stacking can also be used (each array can include multiple array wafers). Alternatively, as shown in the stacking configuration 1104 of FIG. 11C, each CMOS/array pair can be stacked directly on top of one another. Because each memory die is coupled to a CMOS device and each CMOS device includes an ECC unit, the architectures 1102, 1104 in FIGS. 11B and 11C include an equal number of memory dies, CMOS devices, and ECC units.

Also, the CMOS in each CMOS/array pair can manage the programming and reading of data to and from its paired memory. So, when the controller 102 receives a write command from the host 300, the controller 102 can transfer the data associated with the write command to the relevant CMOS/array pair. The CMOS device in that pair can use its ECC module to encode the data with an error correction code (e.g., low-density parity check (LDPC) code and/or parity data) and then program the encoded data in the paired memory array. The reverse operation can be performed when the controller 102 receives a read command from the host 300. The CMOS device can include sense amplifiers to sense and amplify low power signals that represent a bit of a memory cell in a wordline in the memory 104 to a recognizable logic level. The CMOS device can also include latches to latch data and error correction code parity read from or written to the wordline in the memory.

Another advantage of a CBA is that each die can have its own system of read threshold calibration, so that the treatment of read threshold calibration can be offloaded to the CBA for faster parallel operation. In addition, individual die properties can be used to improve read threshold calibration and better tune it for the individual die using the CBA. For example, a CBA can be used to infer an optimal read threshold based on a non-linear function of multiple inputs that reflect current memory and data conditions. In this way, CBA can use efficient mechanisms to tailor a solution to a corresponding die.

Figure 12:
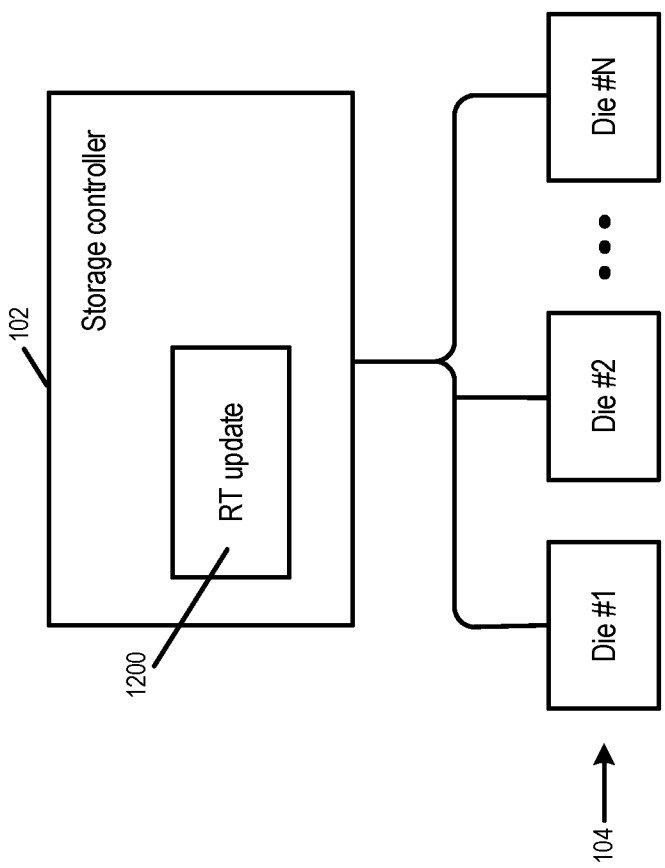
FIG. 12 is a block diagram of a storage system an embodiment that uses machine learning methodologies to derive a read threshold inference function.
Figure 13:
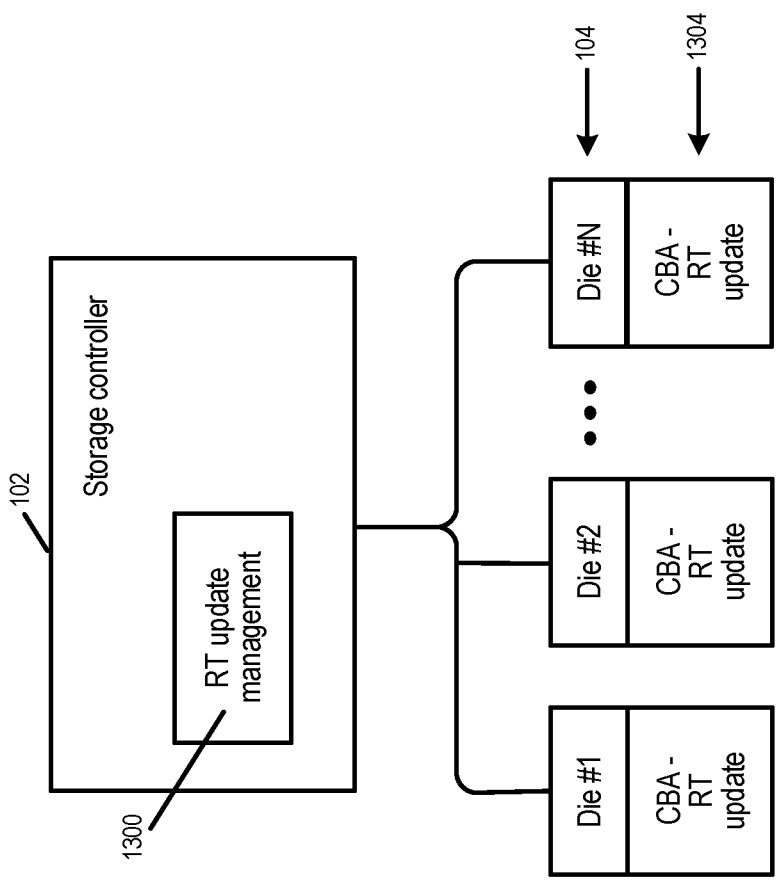
FIG. 13 is a block diagram of a storage system an embodiment that applies CBA-based computations to optimize read thresholds.

Also, CBA can be used to improve the machine learning (ML) methodologies described above to derive a read threshold inference function that makes use of all available information sources. FIG. 12 is a block diagram illustrating an architecture using the machine learning methodologies described above. As shown in FIG. 12, in this architecture, the controller 1002 has a read threshold update module 1200 that applies machine-learning-based methodologies in order to learn a low-complexity inference model for optimal read threshold in the plurality of memory dies in the memory 104 based on all various available parameters. As shown in FIG. 13, in this embodiment, the controller 102 has a read threshold update management module 1300 that applies CBA-based computations providing optimized read thresholds per each die in the memory 104. In this embodiment, each of the dies has an attached CBA read threshold update module 1304 that is responsible for updating the read threshold. These modules 104 can include a machine learning module that uses all available parameters to optimize the read threshold. In FIG. 13, the time and temperature (TT) groups are managed by the read threshold update management module 1300 in the controller 102.

Figure 14:
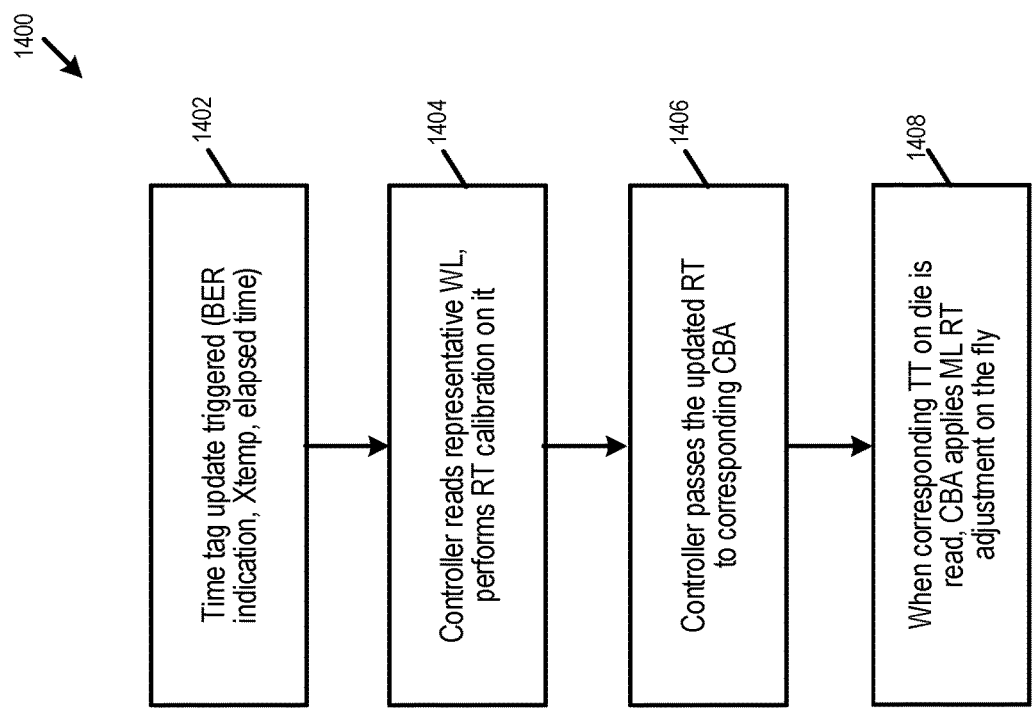
FIG. 14 is a flow chart of a method of an embodiment where time and temperature group information is managed by a controller.

FIG. 14 is a flow chart of a method of an embodiment where time and temperature group information is managed by the controller 102. As shown in FIG. 14, in this embodiment, the controller 102 triggers a time tag update (e.g., based on a BER indication, Xtemp, elapsed time, etc.) (act 1402). Next, the controller 102 reads the representative wordline and performs read threshold calibration on it (act 1404). Then, the controller 102 passes the updated read threshold to the corresponding CBA (act 1406). That CBA then applies machine learning read threshold adjustment on the fly when the corresponding time and temperature group on the die is read (act 1408).

In this embodiment, a module on the CBA is capable of running a machine learning read threshold operation, which may involve a decision tree with different optimization properties. (Examples of symmetric tree models that can be used for read threshold calibration are described in U.S. patent application Ser. No. 17/899,073, filed Aug. 30, 2022, which is hereby incorporated by reference.) As the CBAs can be run in parallel, the read threshold adjustment may be performed simultaneously "on-the-fly" right before the read of the target WL wordline is conducted on the corresponding die.

Figure 15:
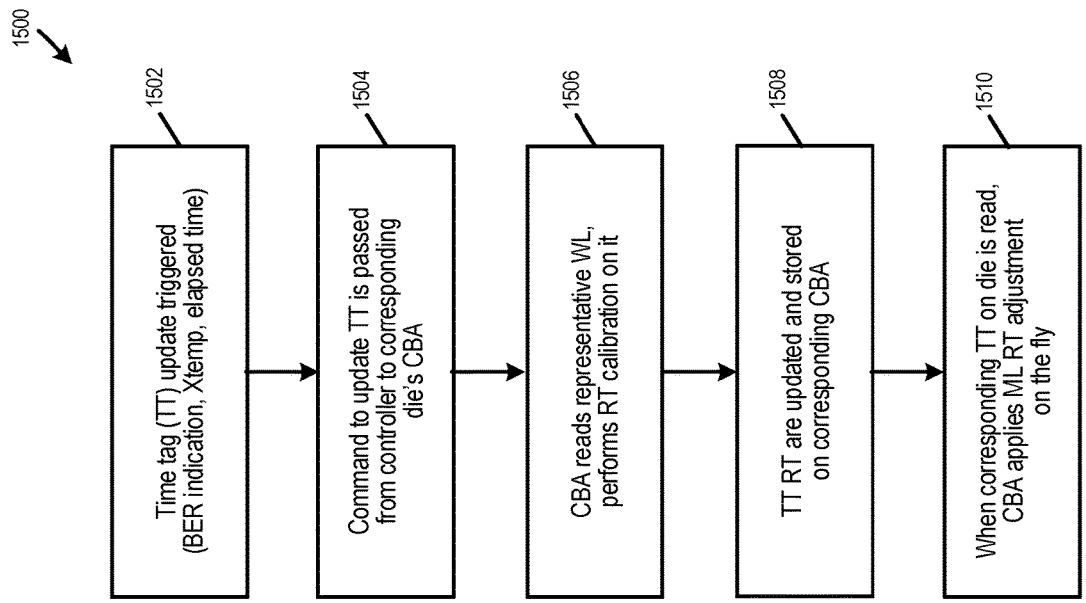
FIG. 15 is a flow chart of a method of an embodiment where time and temperature group information is managed by a CBA.

In another embodiment, the time and temperature group information is managed on the CBA level, while only the trigger to update the time and temperature group information is passed from the controller 102 to the corresponding die's CBA. This is shown in the flowchart 1500 of FIG. 15. As shown in FIG. 15, the controller 102 triggers a time tag update (e.g., based on a BER indication, Xtemp, elapsed time, etc.) (act 1502). Next, the command to update the time and temperature group information is passed from the controller 102 to the corresponding die's CBA (act 1504). The CBA then reads the representative wordline and performs read threshold calibration on it (act 1506). The determined read threshold for the time and temperature group information is then updated and stored in the corresponding CBA (act 1508). Finally, the CBA applies machine learning read threshold adjustment on the fly when the corresponding time and temperature group on the die is read (act 1510). It should be noted that time and temperature tags can be defined on a per-die level, which eases the implementation as each die can update the time and temperature tags without a change to the scheme that currently operates.

Both time and temperature updates (which can apply a read threshold calibration algorithm, such as BES, on the representative wordline) and inference for individual wordline based on the time and temperature read thresholds can be done in parallel over all the different dies. An autonomous CBA time and temperature update triggered by elapsed time or idle time period can also be triggered with this embodiment.

In one embodiment, hardware that supports read threshold calibration, such as BES or Valley Search (VS), can be present on the CBA (VS is a NAND function, so CBA can operate VS on the NAND for this purpose). Also, the time and temperature update can be conducted during idle times of the dies or upon a signal from the controller 102 notifying the CBA to update time and temperature. The trigger to this signal from the controller 102 can be based on any suitable factor, such as, but not limited to, high BER indication, elapsed time, or change in conditions.

In another embodiment, each of the CBA-based machine learning read threshold adjustment modules can be modified to better fit the individual dies. The controller-based system can be based on an identical implementation for all dies. While a die-based system can be implemented on the controller 102 itself, much of the information, such as die temperature or the position of the die in the die-stack, may not be present in the controller 102. It may also be desired to offload the effort to each of the CBAs (each handling only its corresponding die in parallel) rather than having the controller 102 serve all dies and conduct all the computations for all the dies.

One embodiment includes both the "on-line" approach of the machine learning read threshold where training of the model is conducted during the life of the device 100 and the "off-line" approach where most of the training is conducted in the lab over a large dataset of different dies, with fine-tuning conducted on the CBA of the die itself. For example, if one of the dies is an outlier to the lab's dataset, the CBA can make an adjustment based on feedback from the read results on the die itself. Also, each of the dies' CBA can have a "model re-train/fine tune" block to accommodate for the corresponding die. In addition, die settings can be selected from a set of predetermined classes in order to shorten the re-training time.

There are several advantages associated with these embodiments. For example, implementing a machine-language-based approach on the CBA has significant merit due to the parallel processing potential offered by a CBA based system. In addition, each die's model can be tailored specifically to the die it serves without considering the other dies and without consuming additional space. The improved read thresholds can result in reduced BER, which can improve NAND latency and throughput, power consumption, and quality of service (QoS), while reducing correctable ECC (CECC) rates.

Finally, as mentioned above, any suitable type of memory can be used. Semiconductor memory devices include volatile memory devices, such as dynamic random access memory ("DRAM") or static random access memory ("SRAM") devices, non-volatile memory devices, such as ReRAM, electrically erasable programmable read only memory ("EEPROM"), flash memory (which can also be considered a subset of EEPROM), ferroelectric random access memory ("FRAM"), and MRAM, and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/ or over a substrate may be arranged in two or three dimensions, such as a two-dimensional (2D) memory structure or a three-dimensional (3D) memory structure.

In a 2D memory structure, the semiconductor memory elements are arranged in a single plane or a single memory device level. Typically, in a 2D memory structure, memory elements are arranged in a plane (e.g., in an x-z direction plane) that extends substantially parallel to a major surface of a substrate that supports the memory elements. The substrate may be a wafer over or in which the layer of the memory elements is formed or it may be a carrier substrate that is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and wordlines.

A 3D memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements in each column. The columns may be arranged in a 2D configuration, e.g., in an x-z plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the 2D and 3D structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, which are intended to define the scope of the claimed invention. Finally, it should be noted that any aspect of any of the embodiments described herein can be used alone or in combination with one another.

What is claimed is:

1. A storage system comprising:
a memory comprising a plurality of memory dies, wherein each memory die comprises a respective circuit-bounded array; and
a processor coupled with the memory and configured to perform the following for each of the plurality of memory dies:
read a wordline in a memory die;
determine a read threshold based on the read wordline; and
send the read threshold to the circuit-bounded array in the memory die;
wherein each circuit-bounded array is configured to apply a machine-learning-based adjustment to the read threshold.

2. The storage system of claim 1, wherein the wordline read by the processor is part of a time and temperature group and the circuit-bounded array is further configured to apply the machine-learning-based adjustment to the read threshold in response to the time and temperature group being read.

3. The storage system of claim 2, wherein the processor is further configured to manage time and temperature groups of all of the plurality of memory dies.

4. The storage system of claim 3, wherein the processor is further configured to determine the read thresholds in response to a time and temperature group update.

5. The storage system of claim 1, wherein each circuit-bounded array is further configured to apply the machine-learning-based adjustment to the read threshold on-the-fly before reading a target wordline.

6. The storage system of claim 1, wherein at least one circuit-bounded array uses a different machine-learning algorithm than another one of the circuit-bounded arrays.

7. The storage system of claim 1, wherein at least one circuit-bounded array uses a machine-learning algorithm that is trained at least in part off-line.

8. The storage system of claim 1, wherein each circuit-bounded array comprises a respective memory chip and a separate respective complementary metal oxide semiconductor (CMOS) chip.

9. The storage system of claim 1, wherein at least one of the circuit-bounded arrays is a Circuit Above the Array (CAA) device.

10. The storage system of claim 1, wherein at least one of the circuit-bounded arrays is a Circuit Under the Array (CUA) device.

11. The storage system of claim 1, wherein the memory comprises a three-dimensional memory.

12. In a storage system comprising a memory comprising a plurality of circuit-bounded array (CBAs), wherein each CBA includes a memory die, a method comprising:
performing the following in each CBA:
reading a wordline in a time and temperature group in the memory die of the CBA;
determining a read threshold based on the read wordline;
storing the read threshold in the CBA; and
applying a machine-learning-based adjustment to the read threshold.

13. The method of claim 12, wherein each CBA applies the machine-learning- based adjustment to the read threshold on-the-fly before reading a target wordline.

14. The method of claim 12, wherein each CBA comprises the respective memory die and a separate respective complementary metal oxide semiconductor (CMOS) chip coupled to the memory die.

15. The method of claim 12, wherein each CBA determines the read threshold based on the read wordline in parallel with at least one other CBA.

16. The method of claim 12, wherein at least one of the CBAs reads the wordline in the time and temperature group during idle time of its memory die.

17. The method of claim 12, wherein at least one of the CBAs reads the wordline in the time and temperature group in response to receiving a command from a storage controller of the storage system.

18. The method of claim 12, wherein at least one CBA uses a different machine-learning algorithm than another one of the CBAs.

19. The method of claim 12, wherein at least one CBA uses a machine-learning algorithm that is trained at least in part off-line.

20. A storage system comprising:
a memory comprising a circuit-bounded array (CBA) including a memory die; and
means, located in the circuit-bounded array, for:
reading a wordline in a time and temperature group in the memory die of the CBA;
determining a read threshold based on the read wordline;
storing the read threshold in the CBA; and
applying a machine-learning-based adjustment to the read threshold.

* * * * *